US009442658B2

(12) United States Patent
Lendvay

(10) Patent No.: US 9,442,658 B2
(45) Date of Patent: Sep. 13, 2016

(54) APPARATUSES AND METHODS INCLUDING SELECTIVELY PROVIDING A SINGLE OR SEPARATE CHIP SELECT SIGNALS

(71) Applicant: Micron Technology, Inc., Boise, ID (US)

(72) Inventor: William A. Lendvay, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/976,343

(22) Filed: Dec. 21, 2015

(65) Prior Publication Data

US 2016/0103615 A1 Apr. 14, 2016

Related U.S. Application Data

(62) Division of application No. 14/049,711, filed on Oct. 9, 2013, now Pat. No. 9,218,861.

(51) Int. Cl.
*G11C 5/06* (2006.01)
*G06F 3/06* (2006.01)
*G11C 8/12* (2006.01)
*G11C 5/04* (2006.01)
*G11C 11/4097* (2006.01)
*G11C 5/02* (2006.01)
*G11C 7/18* (2006.01)

(52) U.S. Cl.
CPC ............ *G06F 3/0604* (2013.01); *G06F 3/0634* (2013.01); *G06F 3/0673* (2013.01); *G11C 5/063* (2013.01); *G11C 8/12* (2013.01); *G11C 5/025* (2013.01); *G11C 5/04* (2013.01); *G11C 7/18* (2013.01); *G11C 11/4097* (2013.01)

(58) Field of Classification Search
CPC ......... G11C 5/063; G11C 7/18; G11C 5/025; G11C 11/4097; G11C 5/04
USPC .......................... 365/63, 185.05, 185.17, 231
See application file for complete search history.

(56) References Cited

U.S. PATENT DOCUMENTS

| 7,352,602 B2 * | 4/2008 | Janzen ................... G11C 5/02 174/524 |
| 7,546,435 B2 | 6/2009 | Laberge |
| 7,925,844 B2 | 4/2011 | Pax |
| 9,218,861 B2 | 12/2015 | Lendvay |
| 2015/0098295 A1 | 4/2015 | Lendvay |

OTHER PUBLICATIONS

"240pin Unbuffered DIMM based on 1Gb G-die, 78FBGA with Lead-Free & Halogen-Free (RoHS compliant)", Rev. 1.2. Samsung Electronics., [Online]. Retrieved from the Internet: <URL: http://www.samsung.com/global/business/semiconductor/file/2011/product/2011/9/283844ds_ddr3_1gb_g-die_based_udimm_rev12. pdf>, (Aug. 2011), 41 pgs.

\* cited by examiner

*Primary Examiner* — Jason Lappas
(74) *Attorney, Agent, or Firm* — Schwegman Lundberg & Woessner, P.A.

(57) ABSTRACT

Apparatus and methods are disclosed herein, including those that operate to initialize registers of a first memory device and a second memory device of a single-rank memory module by providing separate chip select signals to separately select a first memory device and a second memory device. A method may further include, subsequent to sensing that the initializing is completed, for example, providing a single chip select signal to simultaneously select the first memory device and the second memory device.

12 Claims, 6 Drawing Sheets

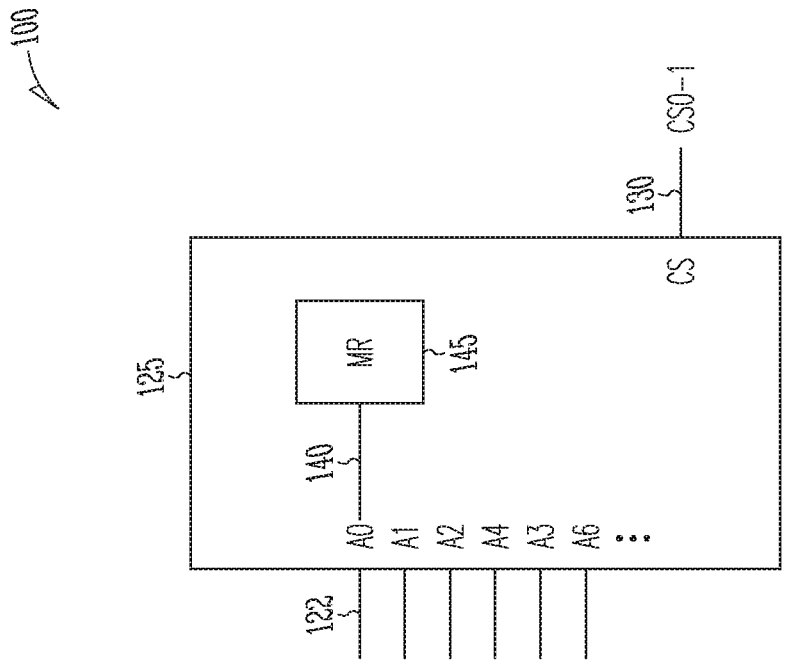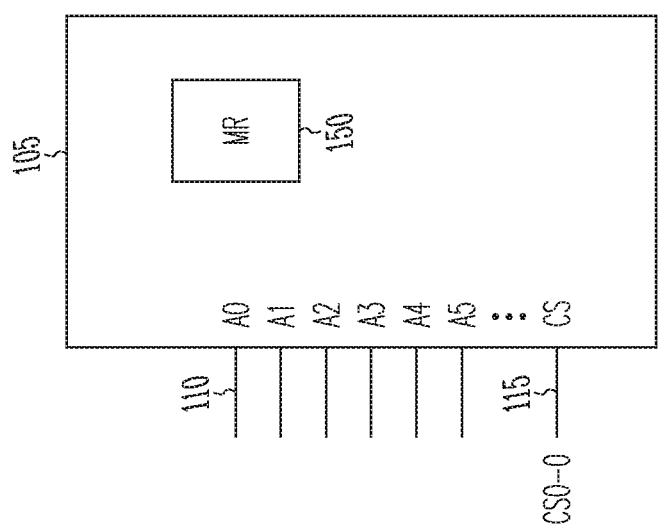
Fig. 1

APPARATUSES AND METHODS INCLUDING SELECTIVELY PROVIDING A SINGLE OR SEPARATE CHIP SELECT SIGNALS

PRIORITY APPLICATION

This application is a divisional of U.S. application Ser. No. 14/049,711, filed Oct. 9, 2013, which is incorporated herein by reference in its entirety.

BACKGROUND

Memory devices are coupled in a mirrored configuration when at least some nodes of a memory device (e.g., address node A3) on one surface of a substrate are coupled to different nodes of a memory device (e.g., address node A4) on the opposite surface of the substrate. For example, in one embodiment, address nodes A3, A4, A5, A6, A7, A8, BA0 and BA1 of a memory device on one surface of a substrate might be respectively coupled to address nodes A4, A3, A6, A5, A8, A7, BA1 and BA0 of a memory device on the opposite surface of the substrate. Some dual- or higher-rank memory modules may couple memory devices in a mirrored configuration, such as to reduce address routing length, thereby improving signal integrity while reducing board space used for address routing. However, some single-rank memory modules may not be able to take advantage of mirrored configurations.

BRIEF DESCRIPTION OF THE DRAWINGS

FIG. 1 is a block diagram of an apparatus in accordance with some embodiments.

DETAILED DESCRIPTION

Figure 2:
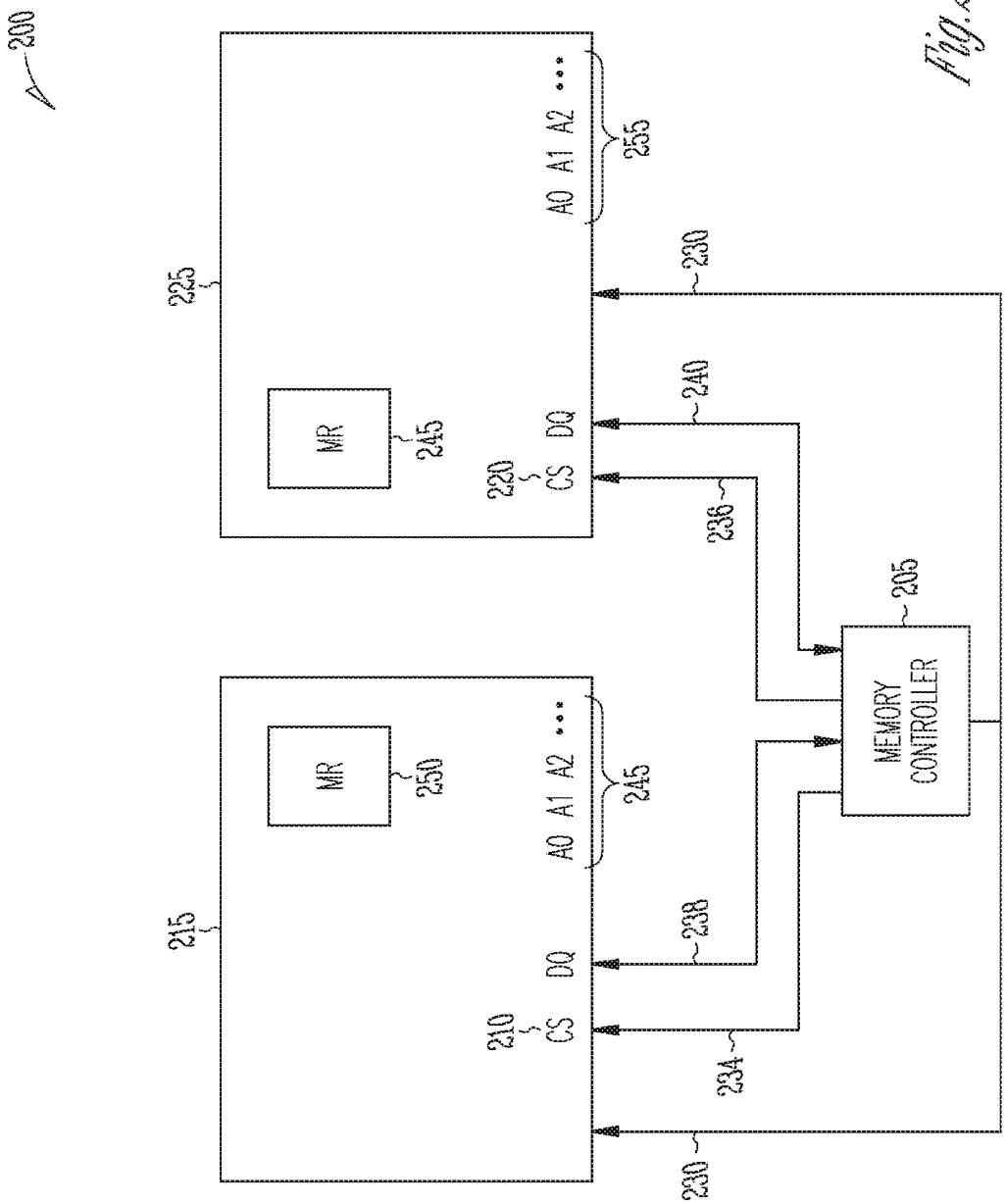
FIG. 2 is a block diagram of a memory system in accordance with some embodiments.

Memory devices are coupled in a mirrored configuration when at least some nodes of a memory device on one surface of a substrate are coupled to different nodes of a memory device on the opposite surface of the substrate. During a normal mode of operation, the memory devices remain agnostic to such mirroring (e.g., any data written to a mirrored address would be read using the same mirrored address). However, there may be other modes of operation, such as a load mode register mode, where the memory devices would not be agnostic to such mirroring (e.g., a specific address is required). In the case of dual-rank (or higher) memory modules, where each of the memory devices in a mirrored configuration can be separately selected using a respective chip select signal, this can be accommodated by using the respective chip select signal to separately select each memory device of the mirrored configuration during initialization (where the selected memory device can be accessed using the corresponding appropriate specific address).

For example, a dual-rank memory module may have a pin A3 coupled to an address node A3 of a first memory device and an address node A4 of a second memory device. Meanwhile, pin A4 of the module may be coupled to an address node A4 of the first memory device and an address node A3 of the second memory device. In a mode of operation such as a load mode register mode, each of the memory devices may need to be accessed with the specific (non-mirrored) address [A3:A4] of [01].

In such a dual-rank memory module, this can be accommodated by, during a first time period, selecting the first memory device with a respective chip select signal (e.g., CS0) and providing an address of [01] to the A3 and A4 pins. During a second time period, the second memory device can be selected with a respective chip select signal (e.g., CS1) and an address of [10] can be provided to the A3 and A4 pins. Because of the mirrored configuration, the second memory device would still be appropriately accessed during the second time period with the specific [A3:A4] address of [01].

Conventional single-rank memory modules, however, may only have or use a single chip select signal. Because single-rank memory modules may only have or use a single chip select signal, a memory controller may not be able to select memory devices on their respective sides of the substrate to separately access specific addresses. Therefore, conventional single-rank memory modules cannot use address mirroring because such modules would be unable to perform, for example, certain initialization procedures, such as loading of a mode register (MR).

These and other concerns may be addressed in some embodiments that provide at least two separate chip select signals to mirrored memory devices in a single-rank memory module during at least one mode of operation. For example, some embodiments may provide two separate chip select signals during loading of the MRs of the mirrored memory devices. At least some embodiments may, subsequent to completion of loading of the MR, provide a single chip select signal to the mirrored memory devices, such as during a normal mode of operation to simultaneously select the mirrored memory devices. The selective provision of either a single chip select signal or multiple, separate chip select signals may be implemented with, e.g., logic circuit elements, software programming, firmware programming, etc.

FIG. 1 is a block diagram of an apparatus 100 in accordance with some embodiments. The apparatus 100 may comprise, for example, a memory module, such as a dual in-line memory module (DIMM), or a device or system that includes a DIMM. The apparatus 100 may comprise, for example, a single-rank DIMM or a device or system that includes a single-rank DIMM.

The apparatus 100 may include a memory device 105. The memory device 105 may include a first node 110 to receive first information, e.g., a first data bit. The first node 110 may include, for example, an address node.

The memory device 105 may include a chip select node 115. The chip select node 115 may receive a signal output from a memory controller (not shown). A memory controller can, in some embodiments, be on the same substrate as the memory device 105, but in other embodiments may be on a separate substrate. In addition, in other embodiments, a memory controller can comprise circuitry on both the same substrate as the memory device 105 and on a separate substrate(s). Still further, in some embodiments a memory controller can be external to a processing resource, such as a central processing unit (CPU), while in other embodiments a memory controller can be integrated (wholly or partially) into such a processing resource.

The apparatus 100 may include another memory device 125. The memory device 125 may also include a chip select node 130 to receive a signal output from the memory controller. In at least some embodiments, the memory controller is coupled to the chip select node 130 independently of the chip select node 115. For example, separate routing conductors may couple the memory controller to the chip select node 130 and the chip select node 115. The memory device 125 may generate register data based on the first information. The memory device 125 may include a MR 145 and the memory device 105 may also include a MR 150.

The memory devices 105 and 125 may comprise dynamic random access memory (DRAM) devices. The memory device 105 may be mounted on a first surface of a substrate (not shown in FIG. 1) and the memory device 125 may be mounted on a second surface of the substrate different from the first surface. While two memory devices 105 and 125 are shown in the apparatus 100, embodiments are not limited thereto, and the apparatus 100 may include any number of memory devices.

FIG. 2 is a block diagram of an apparatus in the form of a memory system 200 in accordance with some embodiments. The memory system 200 may include a memory controller 205.

The memory controller 205 is coupled to a first chip select node 210 of a first memory device 215 of the memory system 200. The memory controller 205 is also coupled to a second chip select node 220 of a second memory device 225 of the memory system 200. Separate routing conductors 234 and 236 (e.g., separate routing lines of a control bus) are used to couple the memory controller 205 to the first and second chip select nodes 210 and 220, such that the memory controller 205 is coupled to the chip select node 130 independent of the chip select node 115 (FIG. 1). The memory devices 215 and 225 are coupled together in a mirrored configuration (not shown). For example, certain address nodes of the first memory device are coupled to different address nodes of the second memory device (e.g., address node A3 of the first memory device 215 is coupled to address node A4 of the second memory device 225).

The memory controller 205 may be mounted on the same substrate (not shown in FIG. 2) as the first memory device 215 and the second memory device 225, or the memory controller 205 may be mounted on a separate substrate (not shown in FIG. 2). The memory controller 205 may be mounted on either surface of the substrate. The first memory device 215 and the second memory device 225 may be mounted on a first surface of the substrate and a second, different surface of the substrate, respectively. The memory devices 215 and 225 may comprise dynamic random access memory (DRAM) devices.

The first memory device 215 and the second memory device 225 may be included in a single-rank DIMM as described above with respect to FIG. 1. The memory controller 205 may communicate with the first memory device 215 and the second memory device 225 via buses. For example the memory controller 205 may communicate commands and addresses unidirectionally with the memory device 215 on a command and address bus 230. The memory controller 205 may communicate commands and addresses unidirectionally with the memory device 225 on the unidirectional command and address bus 230.

The memory controller 205 may provide a single chip select signal to both the first chip select node 210 and the second chip select node 220 in a first mode of operation, such as during read and write command signaling, to simultaneously select the first and second memory devices. The memory controller 205 may provide separate chip select signals to the first and second chip select nodes 210 and 220 in a second mode of operation, such as in a load mode register mode of operation. The selective provision of either a single chip select signal or separate chip select signals may be handled with logic circuitry or through software, firmware, or other programming by the memory controller 205. However, example embodiments are not limited thereto.

The memory controller 205 and the memory device 215 may bidirectionally communicate other data on a data bus 238. The memory controller 205 and the memory device 225 may bidirectionally communicate other data on a data bus 240. Embodiments are not limited to the buses described herein, and buses may include any number of data lines, address lines, or other lines.

The first memory device 215 may include a plurality of nodes 245, for example address nodes A0, A1, A2, A3, A4, A5, A6, A7, etc., in addition to the chip select node 210. Eight address nodes are shown for illustrative purposes only, and embodiments are not limited to the eight address nodes shown. The second memory device 225 may include a plurality of nodes 240 in addition to the chip select node 220, for example a second group of address nodes A0 through A7. A node 245 of the first memory device 215 may be coupled (not shown in FIG. 2) to a node 255 of the second memory device 225. For example, node A3 of the first memory device 215 may be coupled to node A4 of the second memory device 225. Additionally, each of the address nodes may be coupled to a data bus 240, for example. The first memory device 215 and the second memory device 225 may each include a register 245 and 250. The register 245, 250 of either or both of the first memory device 215 and the second memory device 225 may include a MR.

The memory controller 205 may be configured to select the first memory device 215 using an active signal provided to the first chip select node 210. The memory controller 205 may be configured to select the second memory device 225 using an active signal provided to the second chip select node 220. At some time subsequent to selecting the second memory device 225, the memory controller 205 may provide (e.g., transmit) information to be written by the second memory device 225 into the register 245. For example, the memory controller 205 may provide information to each of the address nodes A0 through A7 to be written to the register 245. The information provided to address nodes A0 through A7 may correspond to operational parameters for the memory device 225, for example, burst length, burst sequence, or other parameters of the memory device 225. The memory controller 205 may perform a similar operation on the first memory device 215 after selecting the first memory device 215 using an active signal provided to the first chip select node 210.

The memory controller 205 may be configured to determine that both the first memory device 215 and the second memory device 225 have completed initialization, for example by completing their respective load register modes. For example, the memory controller 205 may dictate the commands and timing and sequence of these commands for loading the mode registers, and thereby the memory controller 205 has knowledge of when the loading is completed.

As a further example, the memory controller 205 may receive a command from a processing resource (not shown in FIG. 2) indicating that initialization is completed. The memory controller 205 may control initializing of the first memory device 215 and the second memory device 225 with a valid MR prior to providing read and write commands to the first memory device 215 and the second memory device 225.

At some time after this determination, the memory controller 205 provides control and address signaling or other signaling in a running (e.g., "normal") operating mode. For example, in some embodiments, the memory controller 205 may provide a single chip select signal to both the first and second chip select nodes 210 and 220 in the normal operating mode to simultaneously select the first and second memory devices.

According to some embodiments, the memory devices 215 and 225 may include dynamic random access memory (DRAM) devices or synchronous dynamic random access memory (SDRAM) devices. Other types of memory may be used. While FIG. 2 illustrates two memory devices 215 and 225, and one memory controller 205, some embodiments may include several memory devices and memory controllers.

Figure 3:
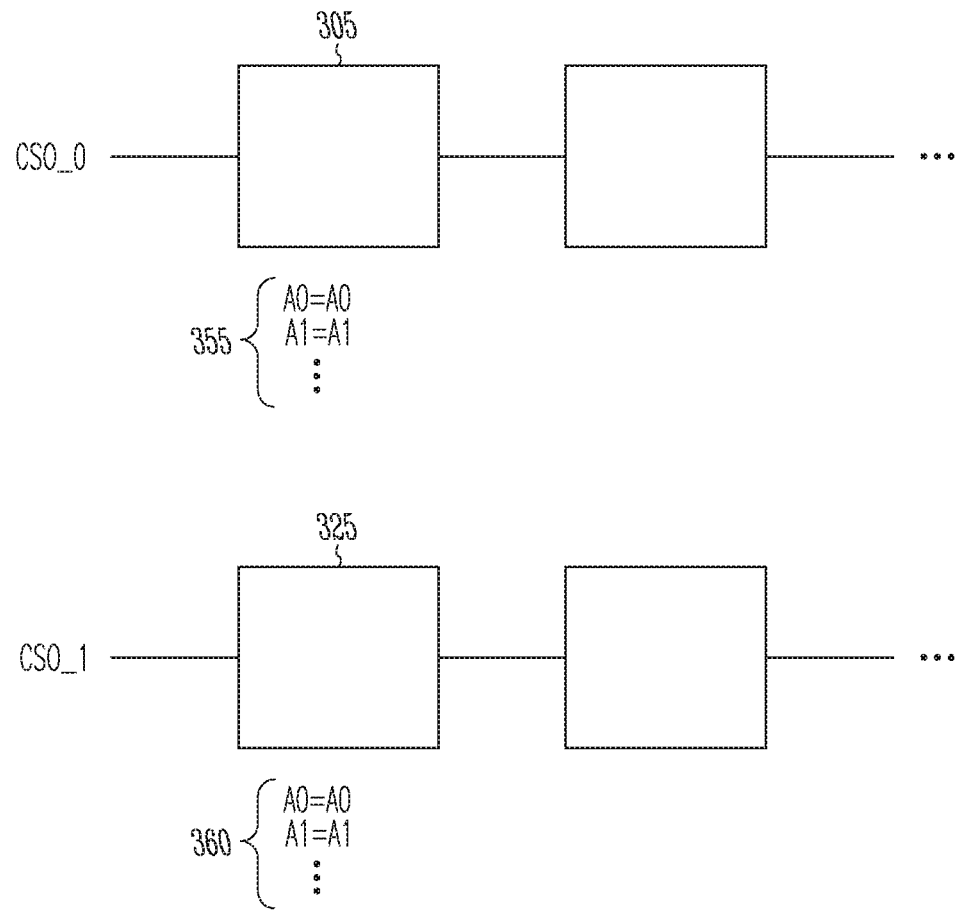
FIG. 3 is a block diagram illustrating separate chip select signals being provided as first and second chip select signals, such as may be used during loading of mode registers (MRs) in accordance with some embodiments.

FIG. 3 is a block diagram illustrating separate chip select signals being provided as first and second chip select signals CS0_0 and CS0_1, such as may be done during loading of MRs 145 and 150 (FIG. 1) in accordance with some embodiments. Chip select signals CS0_0 and CS0_1 can originate from the memory controller 205 (FIG. 2) and pass directly from the memory controller 205 or through a buffer interface to the memory devices 305 and 325. During initialization of the apparatus 100, for example during loading of the MRs 145 and 150, chip select signals CS0_0 and CS0_1 may be active at different times to allow load MR operations to access specific addresses of the memory devices 305 and 325. The memory devices 305 and 325 may be operable to serve as the memory devices 105 and 125 (FIG. 1), respectively.

During initialization, for example during loading of MRs 145 and 150 (FIG. 1), a mirrored memory device 325 is not agnostic to a mirrored address. For example, an address node A4 of mirrored memory device 325 may be coupled to an address pin A3 of a memory module including memory devices 305 and 325 (where address node A3 of memory device 305 may also be coupled to the address pin A3). Although mirrored memory device 325 may be agnostic as to whether its address node A4 is coupled to address pin A3 in some modes of operation (e.g., a normal mode of operation), in other modes of operation (e.g., a load mode register mode), accommodations are made for this mirrored configuration.

For example, a desired configuration for the mode registers (e.g., setting MR3:MR4 to "01") in memory devices 305 and 325 may require setting (or resetting) bits corresponding to address nodes A3:A4 of each of the memory devices to "01". If address pin A3 of the module is coupled to address node A3 of the memory device 305 and address node A4 of the memory device 325, and address pin A4 of a module is coupled to address node A4 of the memory device 305 and address node A3 of the memory device 325, then the same information cannot be provided to address pins A3:A4 (at the same time instance) to accomplish the desired configuration. For example, providing a "01" to address pins A3:A4 would achieve the desired configuration for the mode register of memory device 305 (i.e., setting MR3:MR4 to "01"), but would not result in the desired configuration of the mode register of memory device 325 (e.g., it would set MR3:MR4 to "10"). To accommodate this, the memory controller 205 may provide (e.g., issue) two separate load MR commands for the respective memory devices 305 and 325, and provide two separate chip select signals and two separate addresses (e.g., "01" may be provided to pins A3:A4 when memory device 305 is selected, and "10" may be provided to pins A3:A4 when memory device 325 is selected).

Figure 4:
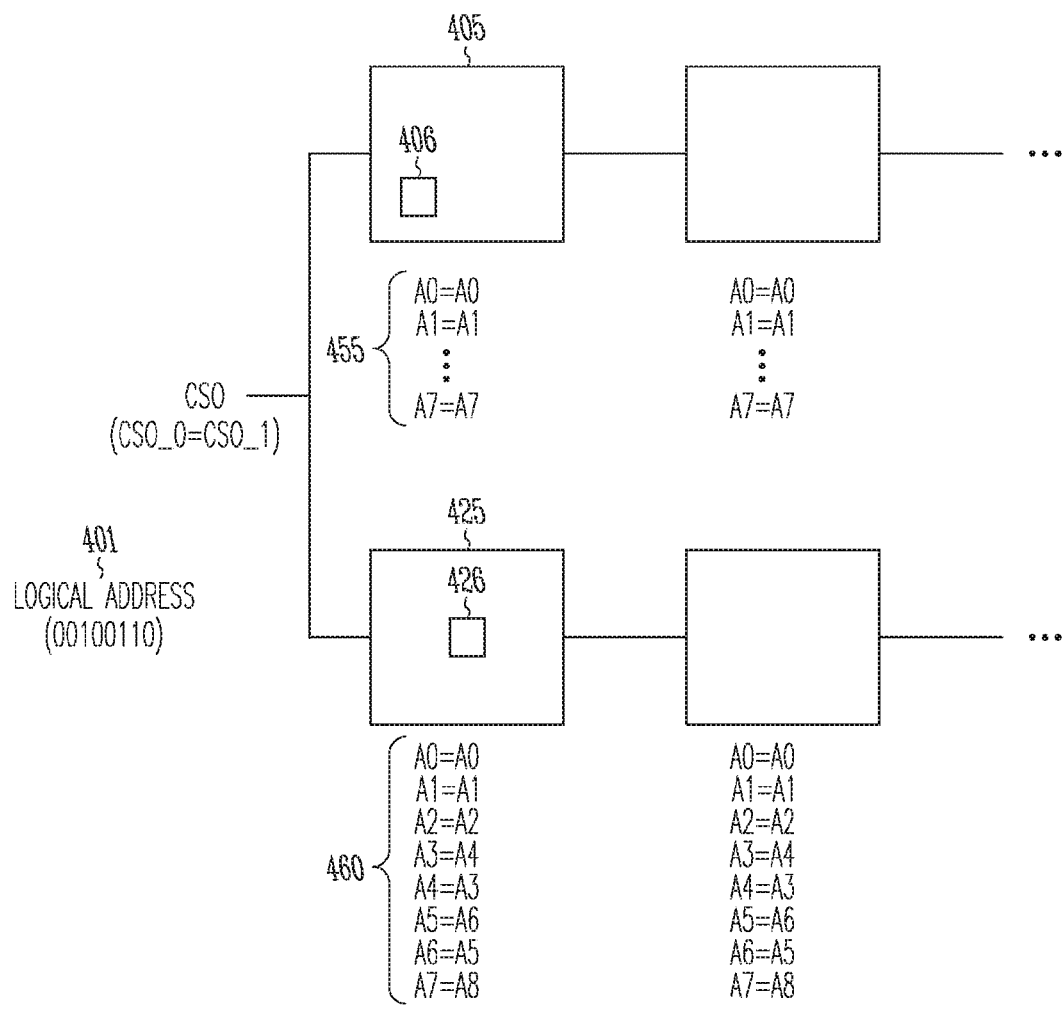
FIG. 4 is a block diagram illustrating a single chip select signal being provided as first and second chip select signals, such as may be used during normal memory device operation after completion of loading of MRs in accordance with some embodiments.

FIG. 4 is a block diagram illustrating providing a single chip select signal to mirrored memory devices for memory device operation, such as may be done after completion of loading of MRs 145 and 150 (FIG. 1) in accordance with some embodiments. In an example embodiment shown in FIG. 4, a memory controller 205 may provide a logical address 00100110 to address pins A0:A7 of a memory module to access memory located at a first physical memory location 406 in a memory device 405 of a group of memory devices on one side of the substrate and to access memory located at a second physical memory location 426 in a memory device 425. While eight address nodes A0-A7 are shown, embodiments are not limited thereto.

Figure 5:
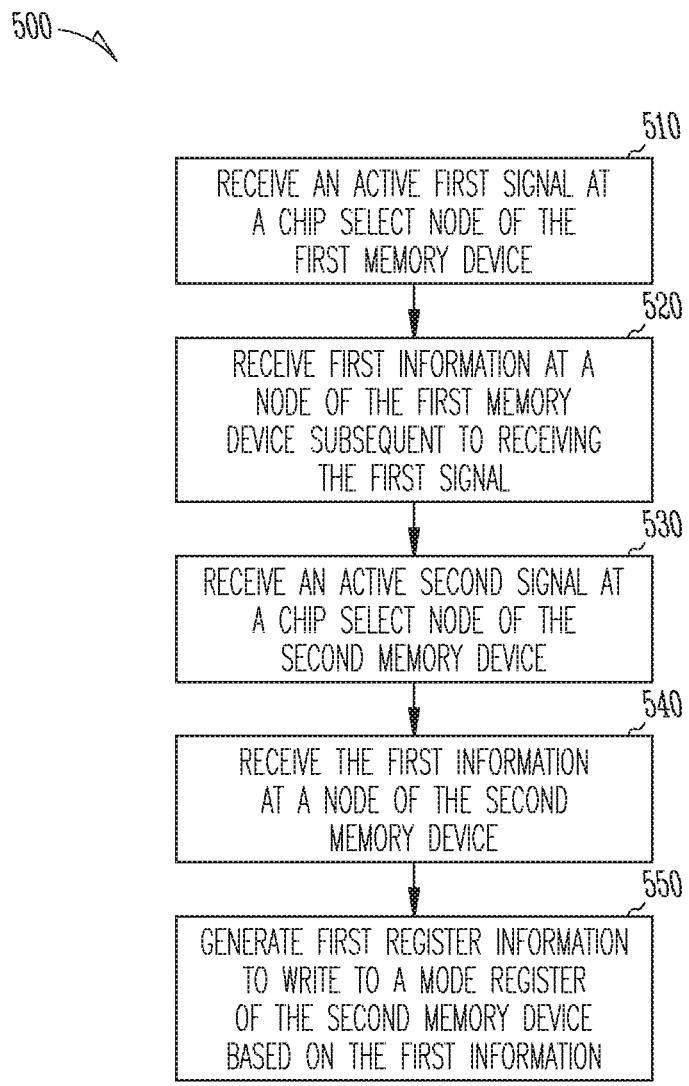
FIG. 5 is a flow diagram of a method of loading a MR of a memory apparatus including a first memory device and a second memory device in accordance with some embodiments.

FIG. 5 is a flow diagram of a method 500 for loading a MR of a memory apparatus including a first memory device and a second memory device. The method may be controlled by a memory controller 205 (FIG. 2), controlling access to an apparatus 100 (FIG. 1). The MR may be either of the registers 145, 150 (FIG. 1), or the registers 245, 250 (FIG. 2). The first memory device and the second memory device may include either of the memory devices 105, 125 (FIG. 1) or the memory devices 214, 225 (FIG. 2).

In operation 510, at a first time instant, a chip select node 115 of the first memory device 105 may receive an active first signal from a memory controller to select the first memory device 105.

In operation 520, subsequent to receiving the active first signal, a node 110 of the first memory device may receive first information.

In operation 530, at a second time instant different from the first time instant, a chip select node 130 of the second memory device 125 may receive an active second signal from the memory controller to select the second memory device 125.

In operation 530, subsequent to receiving the active second signal, a node 122 of the second memory device 125 may receive the first information. In operation 540, the second memory device 125 may generate register information based on the first information, to write to a MR 145 of the second memory device 125. For example, as described above with respect to FIG. 2, the second memory device 125 may generate burst length information for writing to the MR. The first memory device 105 may similarly generate register information based on the first information to write to a MR 150 of the first memory device 105.

Upon sensing that the MRs 145 or 150 have been initialized, the memory controller 205 (FIG. 2) may exit an initialization process. As described above with respect to FIG. 4, the memory controller 205 may perform normal memory operations based on the same chip select signal being provided to the first memory device 105 and the second memory device 125. For example, the memory controller 205 may provide a single chip select signal in association with read, precharge, and other commands to the first memory device 105 and the second memory device 125, in accordance with single-rank DIMM operation.

Figure 6:
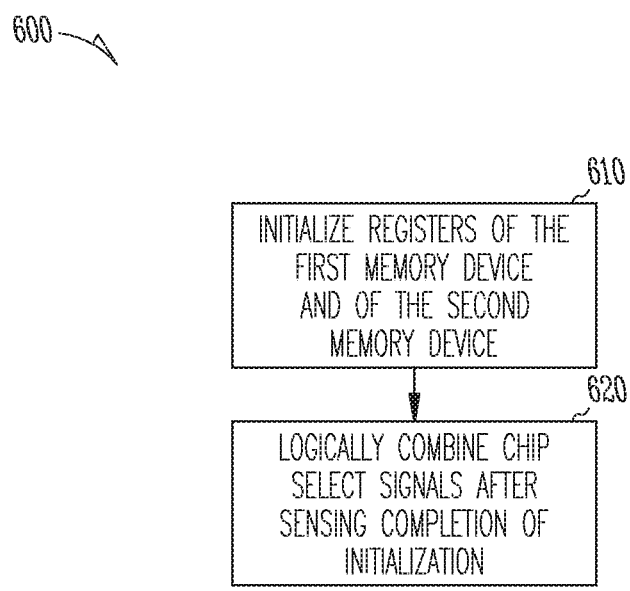
FIG. 6 is a flow diagram of a method of operating a memory system in accordance with some embodiments.

FIG. 6 is a flow diagram of a method 600 for operating a memory system. The method may be controlled by a memory controller 205 (FIG. 2), controlling access to an apparatus 100 (FIG. 1) including memory devices 105 and 125 (FIG. 1) or memory devices 215 and 225 (FIG. 2).

In operation 610, the memory controller 205 may initialize registers 150 and 145 of each of a first memory device 105 and a second memory device 125. The registers 150 and 145 may include MRs.

Initializing the registers 150 and 145 may include providing an active first chip select signal to select the first memory device 105 (while providing an inactive second chip select signal to the second memory device 125). Subsequent to selecting the first memory device 105, the memory controller 205 may load information to the MR 150 of the first memory device 105 by loading the information to a node 110 of the first memory device 105. The node 110 may be an address node A3, which may be coupled to an address pin A3 of a memory module coupled to the memory controller. The information loaded to address node A3 may include information for a burst type of the memory device 105, to be written to bit3 of the MR 150.

Initializing the registers 150 and 145 may further include providing an active second chip select signal to select the second memory device 125 (while providing an inactive first chip select signal). Subsequent to selecting the second memory device 125, the memory controller 205 may load information to a node 122 of the second memory device 125. The node 122 of the second memory device 125 may be an address node A4, which may be coupled to the node 110 (e.g., address node A3) of the first memory device 105 (e.g., where both nodes 110 and 122 are coupled to address pin A3). The information loaded to address node A4 may include information for a CAS latency of the memory device 125, to be written to bit 4 of the MR 145.

In operation 620, after sensing that initialization is completed, the memory controller 205 may provide a single chip select signal in association with accessing the first memory device 105 and the second memory device 125. Some embodiments, therefore, may provide separate chip select signals to mirrored memory devices in at least one mode of operations, such as during initialization, and provide a single chip select signal in another mode of operation (e.g., normal operation, such as during read, write, and other operations after initialization).

The above description and the drawings sufficiently illustrate some specific embodiments to enable those of ordinary skill in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

What is claimed is:

1. A method of operating a memory apparatus, the method comprising:
    providing, during a first mode of operation, an active first signal to a chip select node of a first memory device to select the first memory device;
    providing, during the first mode of operation, an active second signal to a chip select node of a second memory device to select the second device, wherein the second memory device is coupled to the first memory device in a mirrored configuration; and
    providing, during a second mode of operation, an active single signal to the chip select node of the first memory device and to the chip select node of the second memory device to simultaneously select the first and second memory devices.

2. The method of claim 1, wherein the second mode of operation comprises a normal operating mode and further comprising:
    providing first information to a first address node of the first memory device and at a second address node of the second memory device, wherein the first address node of the first memory device is coupled to the second address node of the second memory device; and
    providing second information to a second address node of the first memory device and at a first address node of the second memory device, wherein the second address node of the first memory device is coupled to the first address node of the second memory device.

3. The method of claim 1, further comprising:
    providing an inactive second signal to the chip select node of the second memory device while providing the active first signal to the chip select node of the first memory device; and
    providing an inactive first signal to the chip select node of the first memory device while providing the active second signal to the chip select node of the second device.

4. The method of claim 1, wherein the first mode of operation comprises an initialization mode.

5. The method of claim 1, wherein the first mode of operation comprises a load mode register mode of operation and wherein the second mode of operation comprises a normal mode of operation.

6. The method of claim 1, wherein the second mode of operation is entered after the first mode of operation.

7. An apparatus comprising:
    a memory controller comprising:
        an output to combine a first chip select signal and a second chip select signal into a single chip select signal in a first mode of operation and to provide separate chip select signals as the first and second chip select signals in a second mode of operation.

8. The apparatus of claim 7, wherein the first chip select signal is provided to a first memory device on a first surface of a substrate and the second chip select signal is provided to a second memory device on another surface of the substrate.

9. The apparatus of claim 8, wherein the memory controller is provided on the substrate.

10. The apparatus of claim 8, wherein the memory controller is provided on a separate substrate.

11. The apparatus of claim 7, wherein the memory controller is coupled to the chip select node of the first memory device independently of the chip select node of the second memory device.

12. The apparatus of claim 7, wherein the apparatus further comprises a processing resource coupled to the memory controller.

* * * * *